United States Patent [19]
Takehara et al.

[11] Patent Number: 6,107,560
[45] Date of Patent: Aug. 22, 2000

[54] PHOTOVOLTAIC POWER GENERATION APPARATUS

[75] Inventors: Nobuyoshi Takehara, Kyoto-fu; Hiroshi Kondo, Nara; Seiji Kurokami, Kyotanabe, all of Japan

[73] Assignee: Canon Kabushiki Kaisha, Tokyo, Japan

[21] Appl. No.: 09/071,299

[22] Filed: May 1, 1998

[30] Foreign Application Priority Data

May 14, 1997 [JP] Japan ................................ 9-123989

[51] Int. Cl.$^7$ .................................................. H01L 25/00
[52] U.S. Cl. ............................................................ 136/248
[58] Field of Search ............................................. 136/248

[56] References Cited

U.S. PATENT DOCUMENTS 5,111,127  5/1992  Johnson .................................. 320/2
5,677,833  10/1997  Bingley .................................. 363/71

*Primary Examiner*—Mark Chapman
*Attorney, Agent, or Firm*—Fitzpatrick, Cella, Harper & Scinto

[57] ABSTRACT

A solar cell array used in a photovoltaic power generation apparatus for housing covers a relatively large outside area for installation, and a considerably large earth capacitance Ca exists between the solar cell array and the ground. Further, as an inverter for converting direct-current electric power generated by the solar cell array into alternating-current electric power, a transless-type inverter is used for reducing cost. Therefore, a slight leak current flows via the earth capacitance Ca, which may cause undesirable operation of an earth leakage circuit breaker inserted between the inverter and a commercial AC power system. In the photovoltaic power generation apparatus of the present invention, by designing it so that the relationship between the earth capacitance $Ca[\mu F]$ and leak current detection sensitivity $EL[mA]$ of the earth leakage circuit breaker is $Ca<EL/3$, the undesirable operation of the earth leakage circuit breaker due to the leak current is prevented.

14 Claims, 11 Drawing Sheets

FIG. 9

| | CONDITION 1 | CONDITION 2 | CONDITION 3 | CONDITION 4 |
|---|---|---|---|---|
| NUMBER OF SOLAR CELL MODULES | 100 | 300 | 100 | 100 |
| ADDED CAPACITANCE (μF) | 0 | 0 | 3 | 2 |
| TOTAL CAPACITANCE (μF) | 2 | 6 | 5 | 4 |
| PERIOD OF EXPERIMENT | 30 | 7 | 28 | 30 |
| NUMBER OF OPERATION OF EARTH LEAKAGE CIRCUIT BREAKER | 0 | 3 | 1 | 0 |

COMMERCIAL AC POWER SYSTEM OF 200V, 60Hz
CIRCUIT BRAKER INTERRUPTING RATING 15mA,
NON-OPERATING CIRCUIT RATING 7.5mA

PHOTOVOLTAIC POWER GENERATION APPARATUS

BACKGROUND OF THE INVENTION

The present invention relates to a photovoltaic power generation apparatus, and the design and installation thereof.

The use of photovoltaic power generation apparatuses for housing applications has begun to spread, and research aimed at cost reduction of the apparatuses has been actively performed. As a trump card for the cost reduction, a solar cell module, integrated with a roof material, which obviates the need for a rack, and a non-insulated type inverter, i.e., so-called transless inverter, are being considered for practical use. The efficiency of a transless inverter is high, and transless inverters are inexpensive; therefore, transless inverters have become widely used recently.

FIG. 1 is a block diagram illustrating a configuration of a photovoltaic power generation apparatus which can be tied to a general power system. Electric power is supplied from a solar cell array 1 to a commercial AC power system 3 and/or a load 6 of a customer, supplying electricity, via an inverter 2. Between the inverter 2 and the commercial AC power system 3, earth leakage circuit breakers 4a and 4b are provided, and when a leakage of electricity occurs in a house or building of the customer, the commercial AC power system 3 is completely disconnected.

However, the solar cell array 1 requires a considerably wide outdoor area for installing it, e.g., the solar cell array 1 of 3 kW generation capability requires an area of about 30 $m^2$, and there is considerably large earth capacitance 5 of the solar cell array 1. Accordingly, there is a fear, as pointed out by Furukawa et al. in the national meeting of the Institute of Electrical Engineers of Japan, Industry Application Society in 1996 (article No. 77), that small leak current flows via the earth capacitance 5 and may unnecessarily activate the earth leakage circuit breaker 4a or 4b (i.e., interrupt the circuit). In a case where the earth leakage circuit breaker 4a is activated in response to leak current via the earth capacitance 5, the load 6 is disconnected from the commercial AC power system 3 and an interruption to service occurs. Further, in a case where the earth leakage circuit breaker 4b is activated, photovoltaic power is disconnected; therefore, the electric power generated by the solar cell array 1 is wasted.

The foregoing problems are specific to a case where a transless inverter which directly connects the solar cell array 1 to the commercial AC power system 3 without an insulating transformer is used. Further, in a solar cell module, integrated with a roof material (referred to as "roof solar cell module" hereinafter), formed in such a manner that solar cells having a metal substrate are encapsulated on a metal reinforcing plate, which is the roof material, with resin, the metal reinforcing plate is grounded; therefore, there is a considerably large capacitance between the metal substrate and the metal reinforcing plate. Accordingly, undesirable operation (circuit interruption) of the earth leakage circuit breaker is apt to be induced as described above.

In the article by Furukawa et al., cause of leak (ground) current and its current value are described, however, there is no mention in the article as to what value of capacitance of the earth capacitance 5 would cause the earth leakage circuit to activate. Therefore, it is unclear as to what capacitance the earth capacitance 5 should be limited to when installing the solar cell array 1.

SUMMARY OF THE INVENTION

The present invention has been made in consideration of the above situation, and has as its object to provide a photovoltaic power generation apparatus capable of preventing an earth leakage circuit breaker from undesirably operating, and the design and installation of the apparatus.

According to the present invention, the foregoing object is attained by providing a photovoltaic power generation apparatus used in connection with a commercial AC power system, the apparatus comprising: a solar cell array; a non-insulated type inverter for direct-current electric power output from the solar cell array into alternating-current electric power; and an earth leakage circuit breaker provided between the non-insulated type inverter and the commercial AC power system, wherein stray capacitance $Ca[\mu F]$ of the solar cell array with respect to a ground potential and circuit breaker interrupting rating $EL[mA]$ of the earth leakage circuit breaker have a relationship of $Ca<EL/3$.

Further, the foregoing object is also attained by providing a designing or installing method of a photovoltaic power generation apparatus, used in connection with a commercial AC power system, comprising a solar cell array, a non-insulated type inverter for converting direct-current electric power output from the solar cell array into alternating-current electric power, and an earth leakage circuit breaker provided between the non-insulated type inverter and the commercial AC power system, the method comprising the steps of: measuring or estimating stray capacitance $Ca[\mu F]$ of the solar cell array with respect to a ground potential; and setting circuit breaker interrupting rating $EL[MA]$ of the earth leakage circuit breaker so that relationship of $Ca<EL/3$ is attained.

Further, it is another object of the present invention to provide a chart used when designing or installing a photovoltaic power generation apparatus capable of preventing an earth leakage circuit breaker from undesirably operating.

According to the present invention, the foregoing object is attained by providing a chart used for designing or installing a photovoltaic power generation apparatus, used in connection with a commercial AC power system, comprising a solar cell array, a non-insulated type inverter for converting direct-current electric power output from the solar cell array into alternating-current electric power, and an earth leakage circuit breaker provided between the non-insulated type inverter and the commercial AC power system, wherein the relationship between the number of solar cell modules forming the solar cell array and the leak current flowing via stray capacitance of the solar cell array with respect to a ground potential is recorded in the chart.

Further, the foregoing object is also attained by providing a chart used for designing or installing a photovoltaic power generation apparatus, used in connection with a commercial AC power system, comprising a solar cell array, a non-insulated type inverter for converting direct-current electric power output from the solar cell array into alternating-current electric power, and an earth leakage circuit breaker provided between the non-insulated type inverter and the commercial AC power system, wherein the relationship between the rated power generation of the solar cell array and the leak current flowing via stray capacitance of the solar cell array with respect to a ground potential is recorded in the chart.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

The accompanying drawings, which are incorporated in and constitute a part of the specification, illustrate embodiments of the invention and, together with the description, serve to explain the principles of the invention.

FIG. 9 is a table showing results of an experiment 1; and

DETAILED DESCRIPTION OF THE PREFERRED EMBODIMENT

Preferred embodiments of a photovoltaic power generation apparatus of the present invention will be described in detail in accordance with the accompanying drawings. In a photovoltaic power generation apparatus of the present invention, referring to FIG. 1, the number of solar cell modules configuring a solar cell array 1, and/or circuit breaker interrupting rating of earth leakage circuit breakers 4a and 4b are determined so that stray capacitance $Ca[\mu F]$ of the solar cell array 1 with respect to a ground potential (referred to as "earth capacitance" hereinafter), and leak current detection sensitivity EL[mA] of the earth leakage circuit breakers 4a and 4b have the relationship Ca<EL/3. Then, the photovoltaic power generation apparatus of the present invention is configured on the basis of the determined result.

Figure 5:
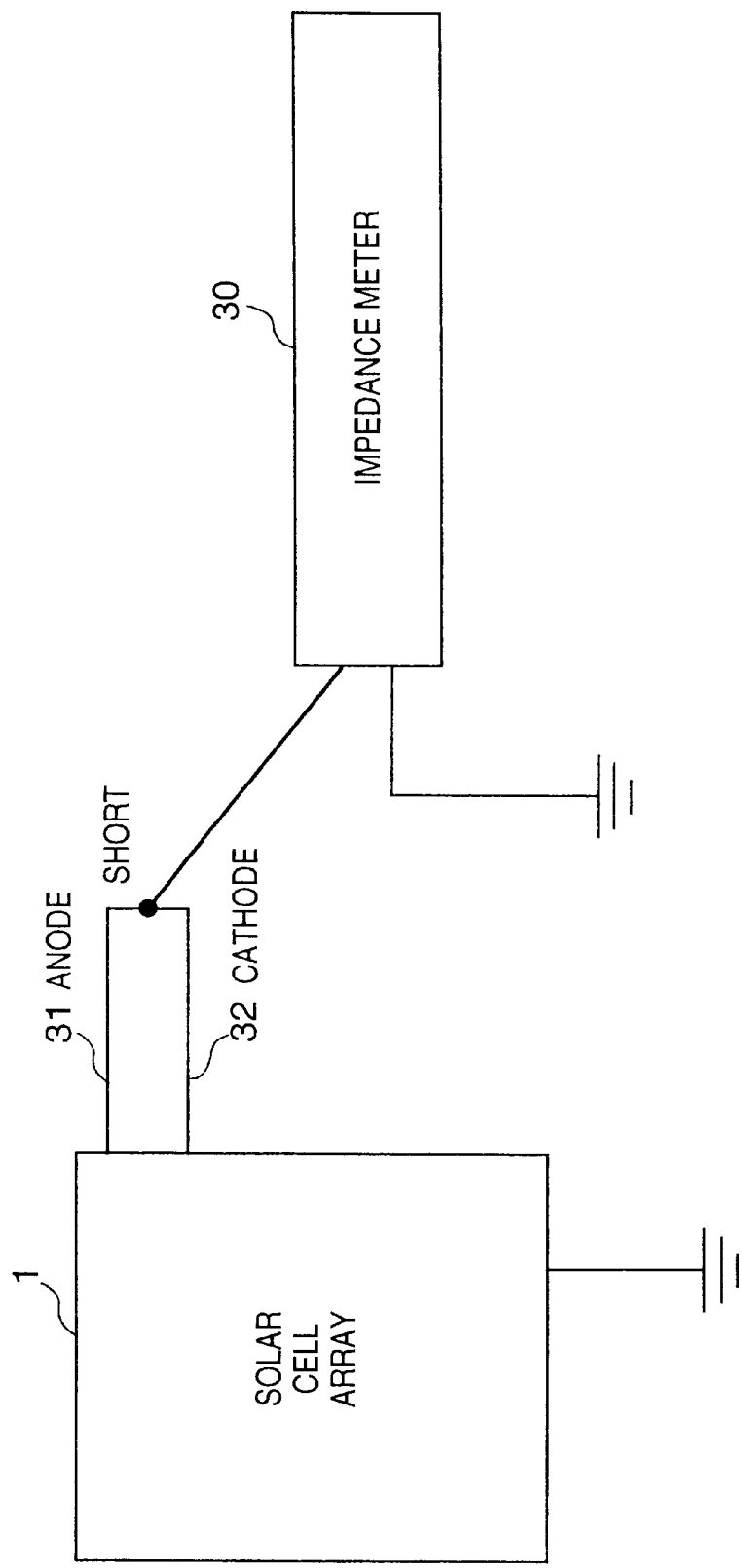
FIG. 5 is a view showing a method for measuring earth capacitance of a solar cell array.

The earth capacitance Ca of the solar cell array 1 can be measured, as shown in FIG. 5, by shorting an anode 31 and a cathode 32 of the solar cell array 1, and connecting an impedance meter 30 between the shorted anode 31 and the cathode 32 and a metal reinforcing plate which is a roof material, for instance.

Each element configuring the photovoltaic power generation apparatus of the present invention will be explained below.

[Solar cell Array]

The solar cell array 1 includes a plurality of solar cell modules connected in series and/or parallel. As the solar cell module, a unit encapsulated and sealed on a reinforced plate, as a roof material, with a resin is preferably used.

As a solar cell, a crystalline silicon solar cell, a polycrystalline silicon solar cell, and an amorphous silicon solar cell, or a compound semiconductor solar cell, such as a copper indium selenide solar cell, may be used. Especially, it is advantageous to use the amorphous silicon solar cell formed by chemical vapor deposition on a long metal substrate to reduce manufacturing cost.

As a material of the reinforcing plate, metal, glass, plastic, and fiber reinforced plastics (FRP), for instance, may be used.

As for a resin for encapsulation and sealing, polyolefine resin, such as ethylene-vinyl acetate copolymer (EVA), ethylene-methyl acrylate copolymer (EMA), ethylene-ethyl acrylate copolymer (EEA), and butyryl resin, urethane resin, and silicon resin may be used. The surface of the solar cell module is coated by a transparent resin film, such as a fluororesin film and an acrylic resin film, as a protective coat. As resins for the encapsulation and sealing and for the film, those having high sunlight transmissivity characteristics are preferred.

Figure 8A:
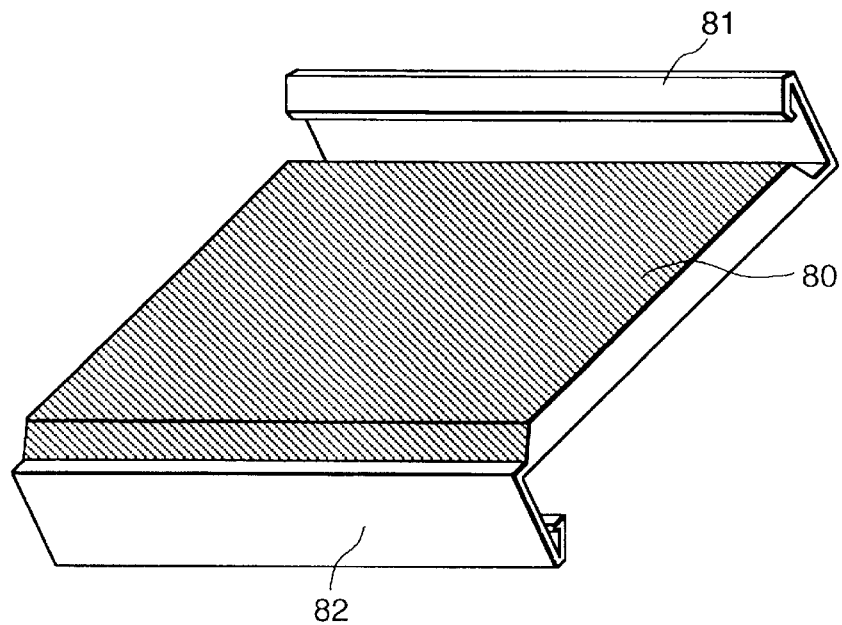
FIGS. 8A to 8C are perspective views showing roof solar cell modules.
Figure 8B:
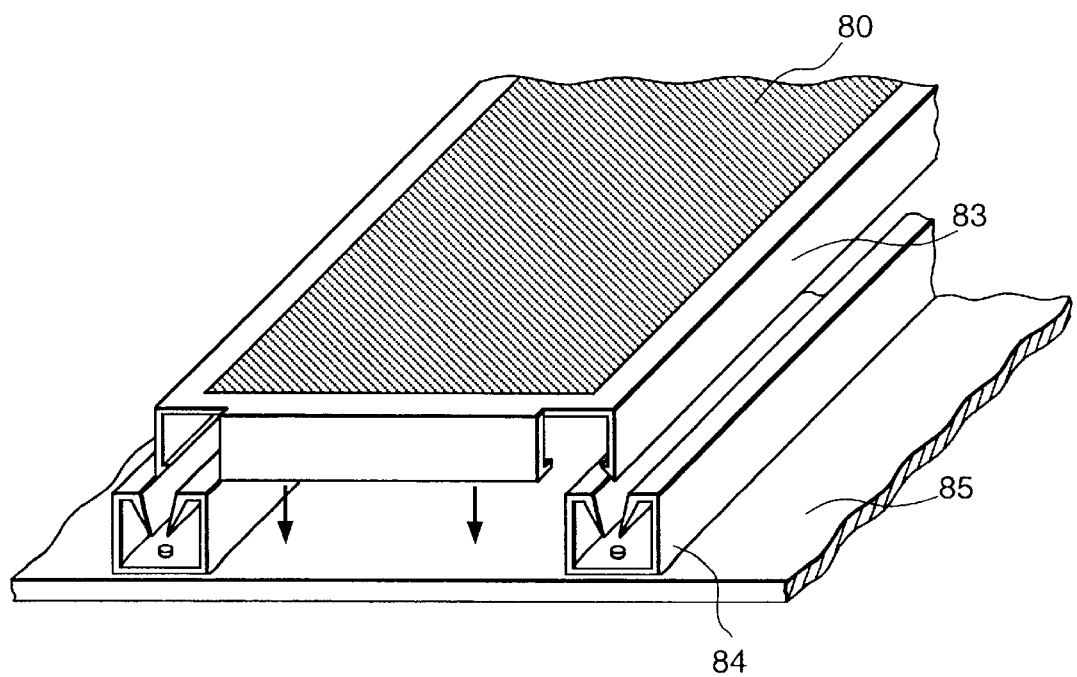
Figure 8C:
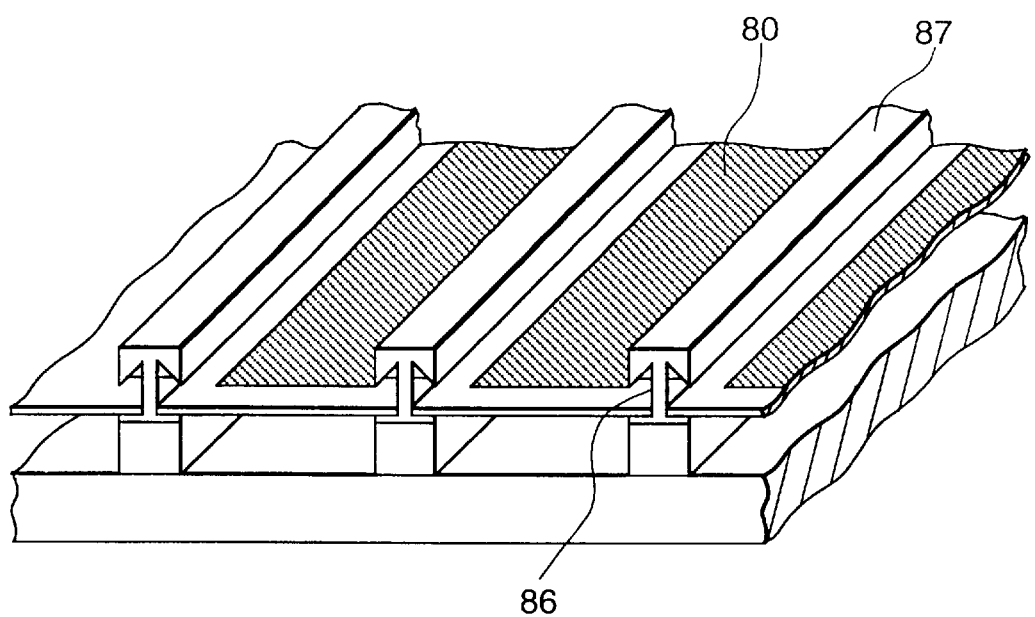

When a metal reinforcing plate is used in the solar cell module, the solar cell module may be used as a building material, such as a wall material and a roof material, by bending to process the metal reinforcing plate. FIGS. 8A to 8C show examples of integrated roof solar cell modules. FIG. 8A shows a roof material having a ridge engagement portion 81 and an eaves engagement portion 82 which are bent in opposite directions; FIG. 8B shows a roof material whose engagement portions 83 are inserted and engaged by fixed members 84 fixed on a roof board 85; and FIG. 8C shows roof materials whose engagement portions 86 of adjoining pairs of the roof materials are held together by caps 87. On the photo-receiving surface of each roof material shown in FIGS. 8A to 8C, the solar cell module 80 is provided.

When glass is used as a reinforcing plate in a solar cell module, the circumference is preferably reinforced by a metal frame.

[Inverter]

The inverter 2 is a transless inverter which does not use an insulating transformer between the direct-current side (the side of the solar cell array 1) and the alternating-current side (the side of the commercial AC power system 3 and the load 6). Since no transformer is used, the transless inverter has great advantages of high conversion efficiency, light weight, and low cost. However, because the commercial AC power system 3 is grounded, the transless inverter on the direct-current side can not be insulated from the commercial AC power system 3.

Further, in order to link the transless inverter with the commercial AC power system 3, it is necessary to provide a series of protective functions for the inverter 2, which are accorded to "Technical Guideline for Electric Interconnection of Generators with Power System" laid down by Ministry of Transport.

[Earth Leakage Circuit Breaker]

The earth leakage circuit breakers 4a and 4b detect zero-phase-sequence current which is the total of current flowing through a plurality of wires which form a circuit, and when the zero-phase-sequence current exceeds the circuit breaker interrupting rating (leak current detection sensitivity) EL, the earth leakage circuit breakers interrupt the circuit. Further, when the zero-phase-sequence current is smaller than non-operating current rating, namely, in a dead band of the earth leakage circuit breakers, then the earth leakage circuit breakers do not interrupt the circuit. Generally, the value of the non-operating current rating is set to half the value of the circuit breaker interrupting rating EL. Various earth leakage circuit breakers whose circuit breaker interrupting ratings EL are set between 15 mA and 100 mA are on the market, and the one having a proper circuit breaker interrupting rating EL can be selected depending upon the electric device to be connected. Further, many earth leakage circuit breakers have an overcurrent protective function.

[Embodiment]

The relationship between the earth capacitance Ca and the circuit breaker interrupting rating EL of the earth leakage circuit breakers 4a and 4b was determined by the results of the following experiments.

(Experiment 1)

Condition 1

Figure 1:
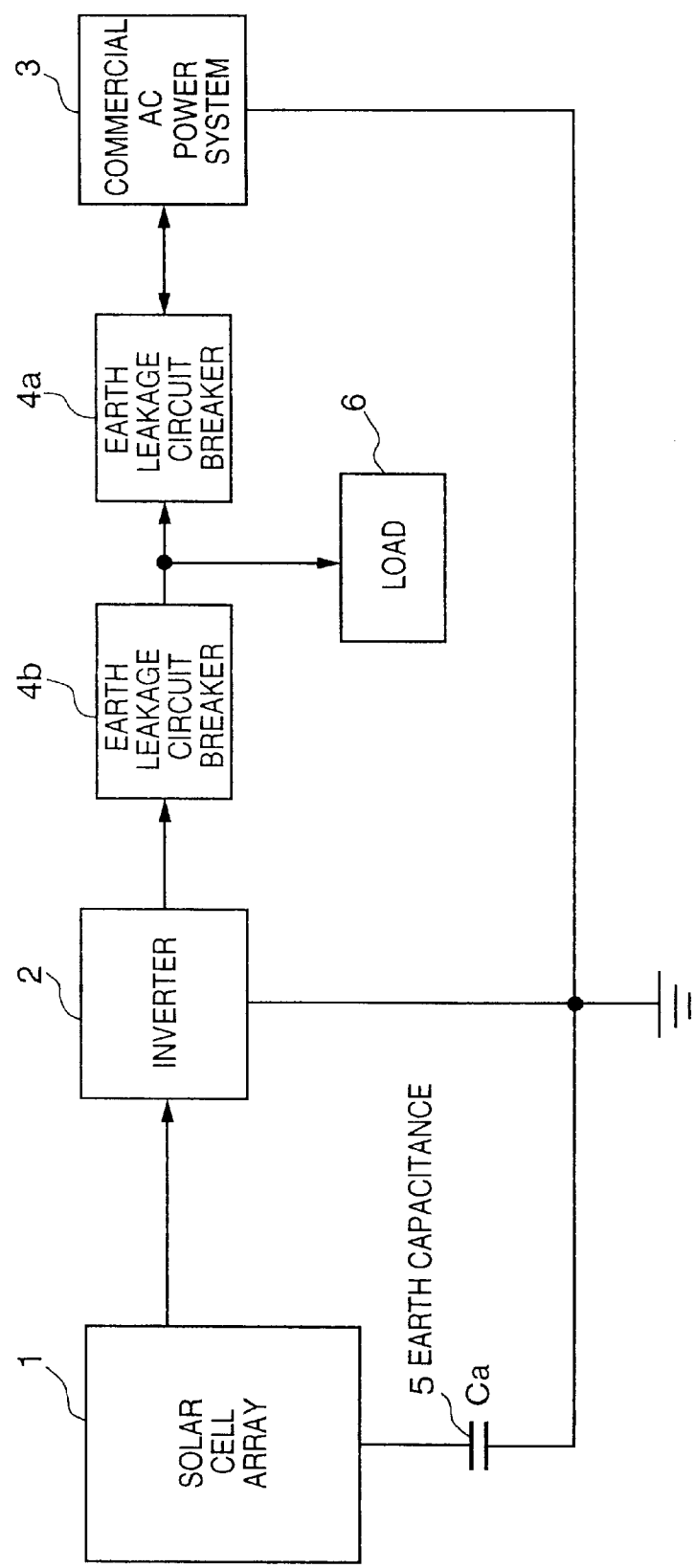
FIG. 1 is a block diagram illustrating a configuration of a system interconnection of a photovoltaic power generation apparatus.
Figure 2:
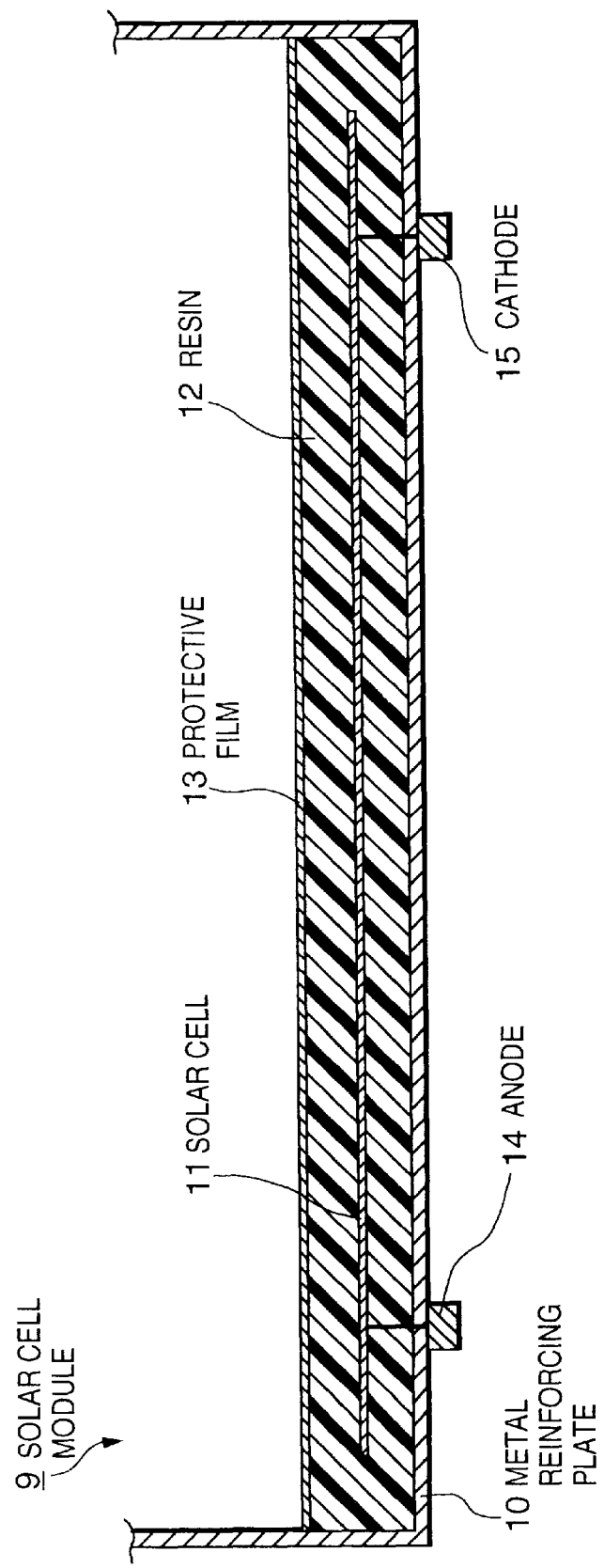
FIG. 2 is a cross-sectional view showing a structure of a solar cell module.

In the photovoltaic power generation apparatus shown in FIG. 1, the solar cell array 1 is formed by connecting 100 solar cell modules 9 (FIG. 2). The solar cell array 1 is installed on a metal rack on the ground with a slope of 30 degrees, facing to the south.

FIG. 2 is a cross-sectional view of the solar cell module 9, and an amorphous solar cell 11 is encapsulated and sealed on a metal reinforcing plate 10 with a resin 12, such as an EVA resin. The surface of the solar cell module is coated with a protective film 13, such as an ethylene tetrafluoroethylene (ETFE) film. The metal plate 10 which is in the backside of the solar cell module 9 is grounded.

Figure 3:
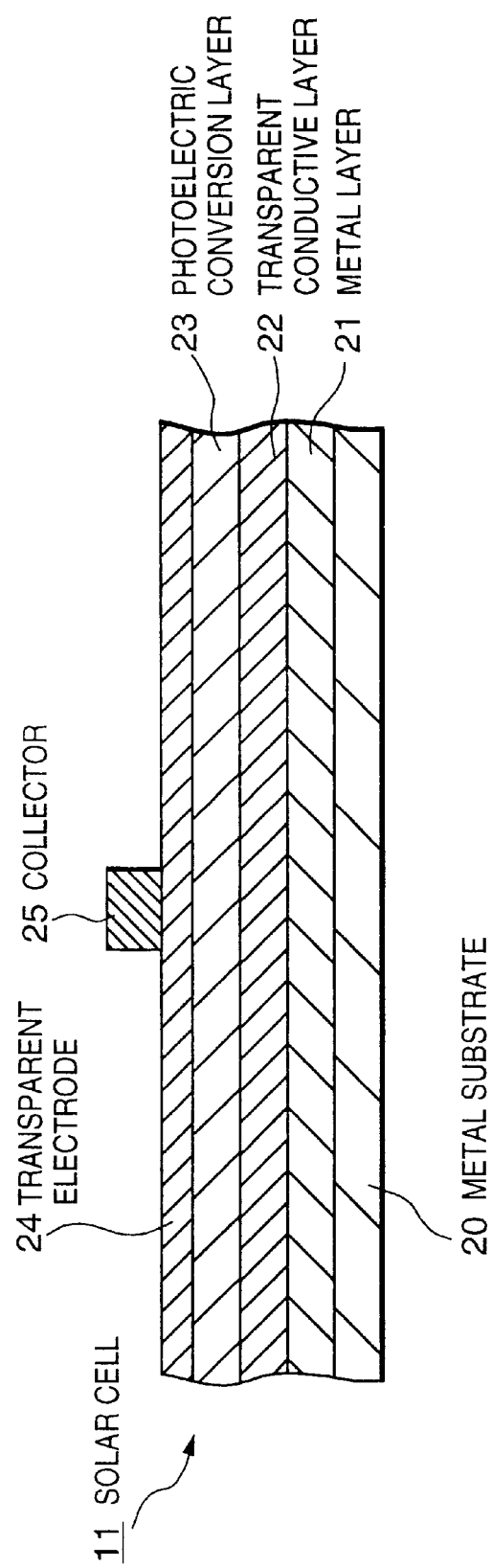
FIG. 3 is a cross-sectional view showing an example structure of a solar cell.

FIG. 3 is a cross-sectional view of the amorphous solar cell 11 which is formed in such a manner that a metal layer 21, a transparent conductive layer 22, a photoelectric conversion layer 23, a transparent electrode 24, and a collector 25 are stacked on a metal substrate 20. The photoelectric conversion layer 23 is formed by stacking a pin junction of three-layer amorphous silicon.

As the inverter 2, a transless-type inverter (available from Toshiba Corp., Product Type PVUL0035) is used.

As for the earth leakage circuit breakers 4a and 4b, those whose leak current detection sensitivity EL is 15 mA, non-operating current rating is less than 7.5 mA, and rated current is 30A (available from Matsusita Electric Works, Ltd., Product Type BJJ330225K) are used. These earth leakage circuit breakers are connected to the commercial AC power system 3 (60 Hz, 200V) to form a photovoltaic power generation apparatus for the experiment.

Figure 4:
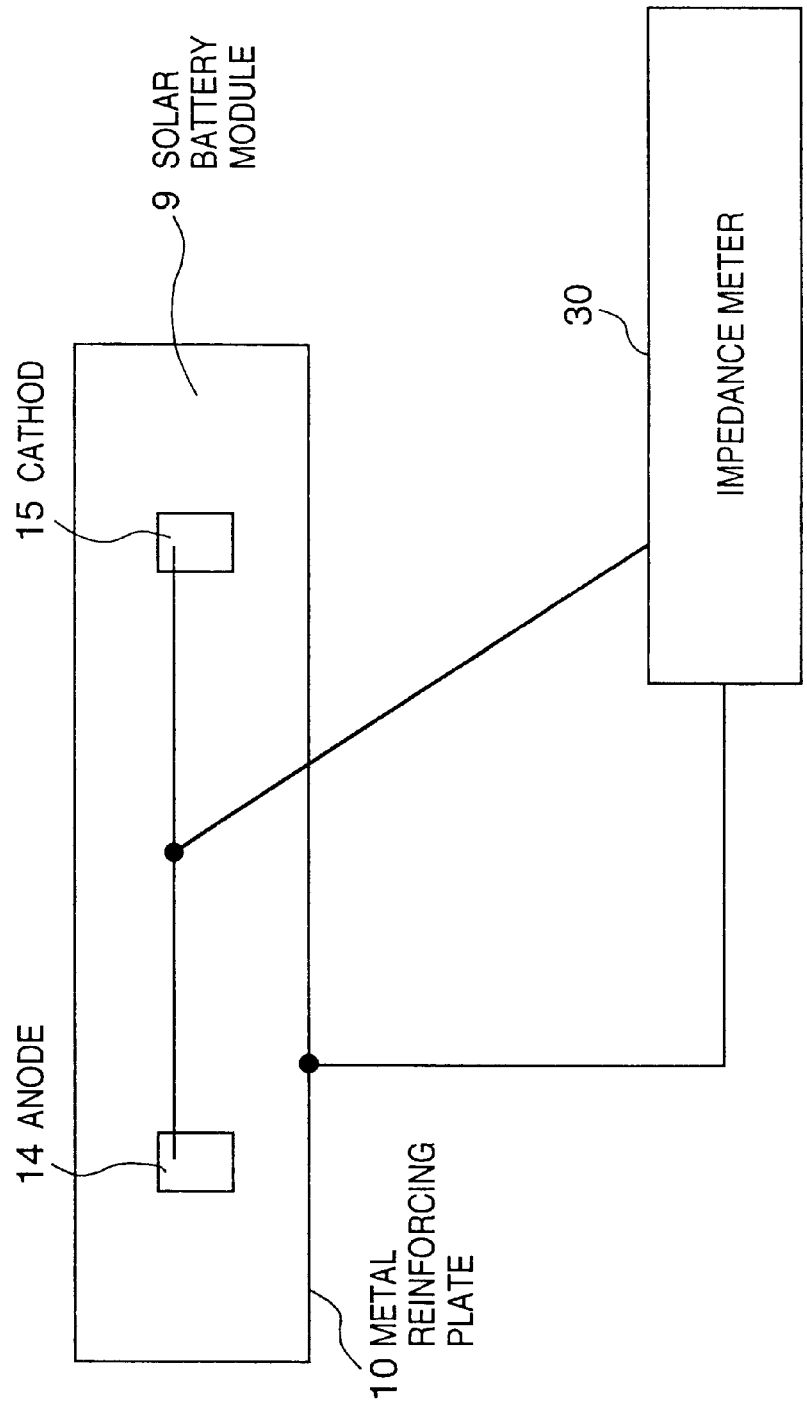
FIG. 4 is a view showing a method for measuring earth capacitance of the solar cell module.

Capacitance Cx of each solar cell module 9 is measured by the impedance meter 30 (available from Hioki E. E. Corp., Product Type 3520 LCR-Hi-TESTER) which is connected between a shorted node between the anode 14 and the cathode 15 and the metal reinforcing plate 10, as shown in FIG. 4. The measured capacitance Cx of the solar cell module 9 (width: 45 cm, length: 130 cm) was 20 nF. As a measuring frequency, 120 Hz which is a ripple frequency of the inverter 2 is selected.

Next, with the anode 31 and the cathode 32 of the solar cell array 1 being shorted as shown in FIG. 5, the earth capacitance Ca of the solar cell array 1 was measured and it was 2 μF, which is just 100 times larger than the capacitance Cx of each solar cell module 9.

Accordingly, in the solar cell array using the solar cell module having a metal frame, such as the metal reinforcing plate 10, the earth capacitance Ca of the solar cell array can be measured between the metal frame which is grounded, and the shorted node between electric output terminals of the solar cell array.

The photovoltaic power generation apparatus installed as described above was run for a month, and the earth leakage circuit breakers were not activated during this period.

Condition 2

200 solar cell modules 9 were added to the foregoing configuration of the photovoltaic power generation apparatus. Within a week of running the photovoltaic power generation apparatus, three undesired operations of the earth leakage circuit breakers were observed. The measured earth capacitance Ca at those times was 6 μF.

Condition 3

Next, the number of the solar cell modules forming the solar cell array 1 was reduced to 100, then film capacitors of 1.5 μF were provided between the anode 31 and the ground, and between the cathode 32 and the ground, providing a total capacitance of 3 μF. With this configuration, the earth capacitance Ca of the solar cell array 1 was 5 μF. Within four weeks of running the photovoltaic generation apparatus, the earth leakage circuit breakers were undesirably activated once.

Condition 4

Next, capacitance of the capacitors to be added was reduced to 1 μF to make the total earth capacitance Ca of the solar cell array 1 equal to 4 μF. Under this condition, no undesirable operation of the earth leakage circuit breakers was observed in one month of the experiment.

Results

The results of Experiment 1 are shown in FIG. 9. Referring to FIG. 9, it is known that, when the earth capacitance Ca [μF] of the solar cell array 1 is set about one-third of the sensitivity EL (15 mA) of the earth leakage circuit breakers, namely, EL[mA]/3=5[μF], no undesirable operation of the earth leakage circuit breakers occurs.

The foregoing relationship holds for most photovoltaic power generation apparatuses using a transless inverter as the inverter 2, regardless of the type of solar cell array 1 or earth leakage circuit breakers 4a and 4b.

(Experiment 2)

In Experiment 2, the solar cell array 1 is set on the roof of a building, and the earth capacitance Ca is changed by changing the rated power generation of the solar cell array, i.e., by changing the number of the solar cell modules 9 forming the solar cell array 1. Then, with the different numbers of the solar cell modules 9, leak current is measured to clarify that the leak current falls within a dead band (generally, less than 50% of the leak current detection sensitivity EL when the leak current detection sensitivity EL is 30 mA, the dead band is held less than 15 mA) of earth leakage by designing the photovoltaic power generation apparatus on the basis of the results of the Experiment 1. As for the inverter 2, a different type inverter from that used in Experiment 1 is selected so as to prove that the photovoltaic power generation apparatus of the present invention gives essentially same effect regardless of the type of the inverter 2.

Figure 6:
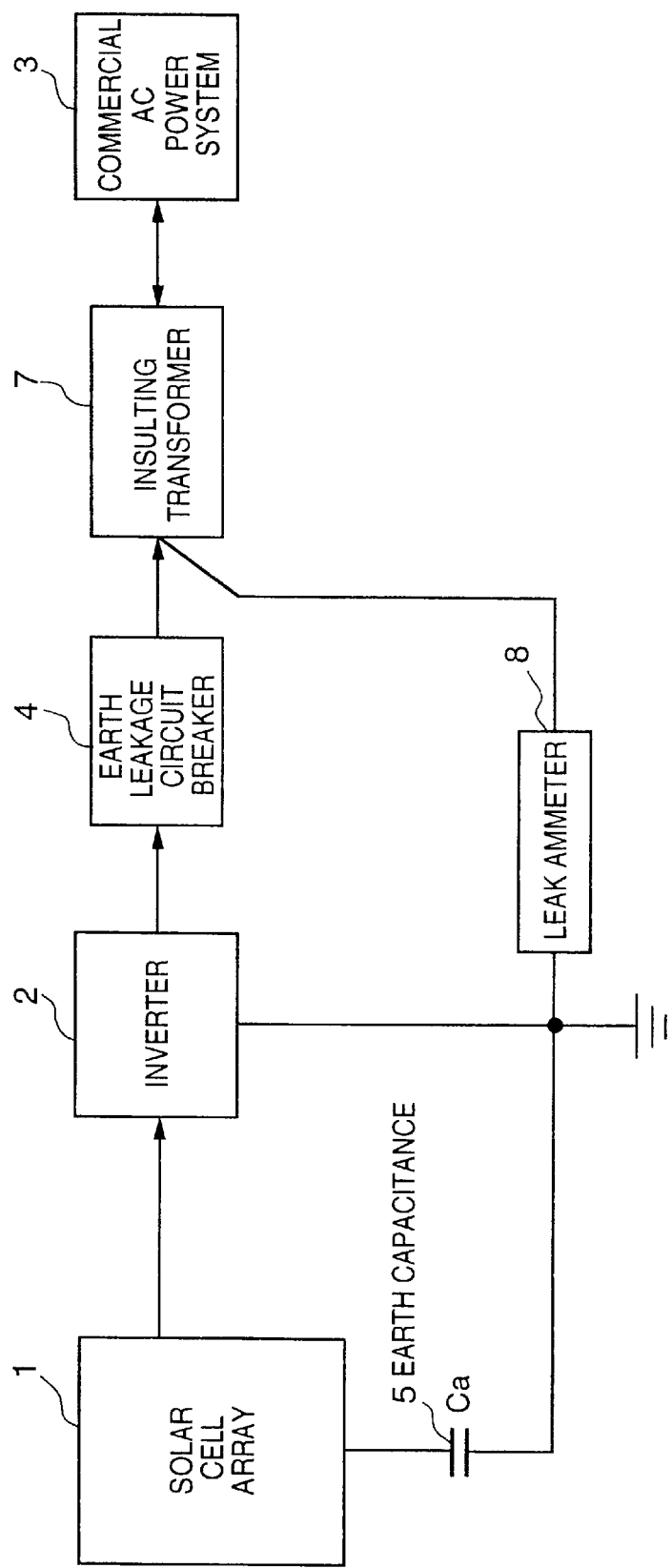
FIG. 6 is a block diagram illustrating a configuration of a photovoltaic power generation apparatus used in an experiment 2.

FIG. 6 is a block diagram illustrating a configuration of the photovoltaic power generation apparatus used in Experiment 2. A transless inverter available from Japan Storage Battery Co., Ltd., Product Name of LINEBACK-EX is used as the inverter 2.

The solar cell array 1 has 696 integrated roof solar cell modules, each shown in FIG. 8A, arranged in 58 strings, each including 12 modules connected in series, and the strings connected in parallel. The configuration of the solar cell 80 is the same as that used in Experiment 1, except that the photoelectric conversion layer is formed by stacking a pin junction of two-layer amorphous silicon. The capacitance Cx of each roof solar cell module is about the same as that of the solar cell module 9 used in Experiment 1. The area of the solar cell array 1 using the aforesaid roof solar cell modules is about 300 m². The measured earth capacitance Cs of a string of the solar cell modules (i.e., 12 modules connected in series) was 240 nF.

As an earth leakage circuit breaker 4, a breaker of rated current of 50A, leak current detection sensitivity of 30 mA, and non-operating current rating of 15 mA (available from Matsusita Electric Works, Ltd., Product Type BJ35025K1) was selected, and connected to the commercial AC power system 3 of 60 Hz and 200V via an insulating transformer 7. The reason for using the insulating transformer 7 is to make it possible for a leak ammeter 8 to measure leak current in the secondary side (i.e., the side of the solar cell array 1) of the insulating transformer 7, and there is no impact to the embodiment of the present invention. In other words, for operating the photovoltaic power generation apparatus of the present invention in practice, the insulating transformer 7 is not used.

Figure 7:
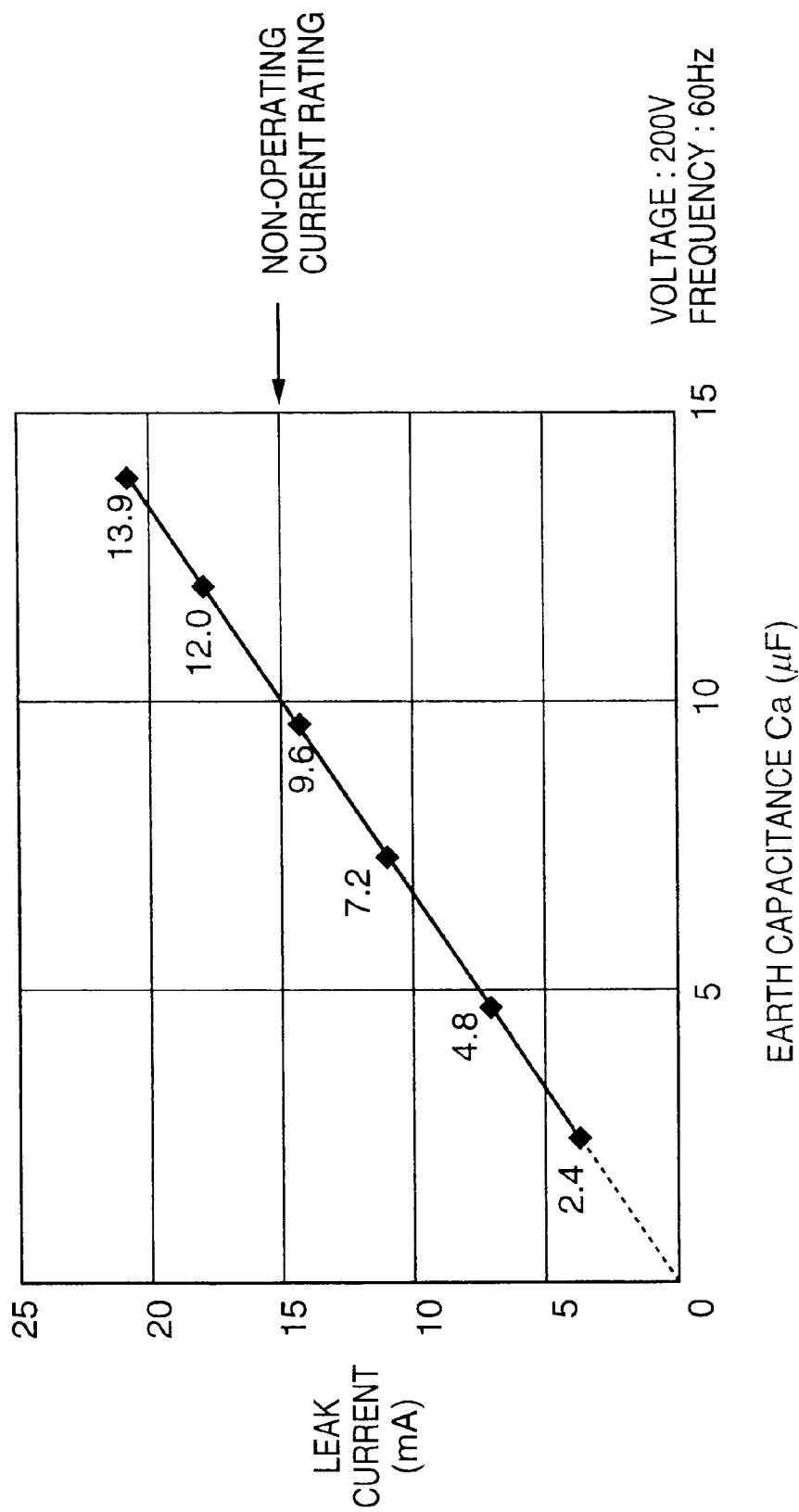
FIG. 7 is a graph showing the relationship between measurement results of leak current and earth capacitance.

The rated power generation of the solar cell array 1 was increased by 10 strings, namely, the earth capacitance Ca was increased by 2.4 $\mu$F, and respective leak current (frequency of equal or less than 1 kHz) was recorded. The reason for setting the frequency range for measuring the leak current to equal or less than 1 kHz was due to the frequency range of sensitivity of the earth leakage circuit breaker which was set to equal or less than 1 kHz. FIG. 7 is a graph showing the measurement results of leak current with respect to the earth capacitance Ca obtained as described above. Note, numerals shown by square points on a straight line in the graph indicate the number of connected strings of the solar cell modules.

As clearly seen from the measurement results, by limiting the earth capacitance Ca to less than a third of the leak current detection sensitivity EL, i.e., EL/3=30/3=10 $\mu$F, the leak current falls within the dead band (less than 15 mA) of current of the earth leakage. Thus, it is proven that the knowledge obtained from Experiment 1 holds when the inverter 2 and an installing place are changed. Therefore, in the photovoltaic power generation apparatus of the present invention designed on the basis of the knowledge obtained from Experiment 1, it is possible to prevent the earth leakage circuit breaker from being undesirably activated due to the earth capacitance of a solar cell array.

A photovoltaic power generation apparatus designed on the basis of the knowledge obtained from Experiment 1 and 2 provides following effects.

(1) By constraining leak current due to earth capacitance of a solar cell array within the dead band of an earth leakage circuit breaker, it is possible to prevent undesired operation of the earth leakage circuit breaker due to the earth capacitance of the solar cell array.

(2) It is possible to prevent interruption of service to a customer, where the photovoltaic power generation apparatus is installed, caused by the undesirable operation of the earth leakage circuit breaker due to the earth capacitance of the solar cell array.

(3) Since the interruption to service explained in (2) often causes termination of operation of the photovoltaic power generation apparatus simultaneously, by preventing the interruption, it is possible to avoid wasting generated power.

Thus, effects of the photovoltaic power generation apparatus of the present invention are very noticeable, and industrial utility value is very high.

Figure 10:
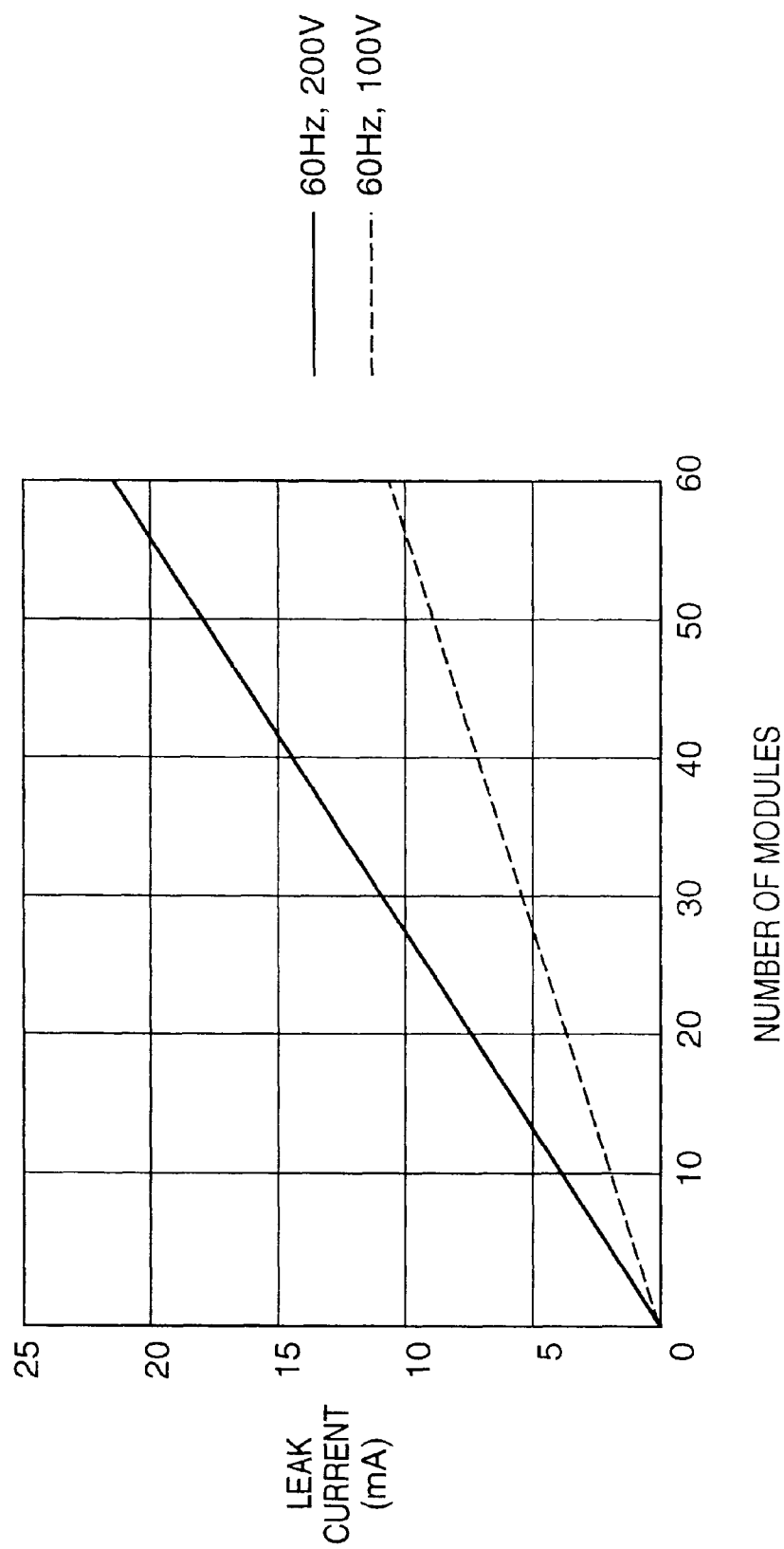
FIG. 10 is a design chart used by a designer or installer of a photovoltaic power generation apparatus.

It is apparent that the leak current detection sensitivity EL and/or the non-operating current rating of the earth leakage circuit breaker of the photovoltaic power generation apparatus of the present invention is designed on the basis of the graph (design chart) shown in FIG. 7, based on the results of the Experiments 1 and 2. Further, a design chart in FIG. 10 shows the relationship between the number or rated power generation of the solar cell modules used in a solar panel and the leak current. A designer or installer of the photovoltaic power generation apparatus is able to determine leak current of the photovoltaic power generation apparatus to be designed or installed from the design chart shown in FIG. 7 or 10 by measuring or estimating the earth capacitance of the solar panel or on the basis of the desired number of solar cell modules or desired rated power generation of the solar panel. Then, the designer or installer is able to set the leak current detection sensitivity EL and/or the non-operating current rating on the basis of the obtained leak current so that no undesirable interruption due to the earth capacitance of the solar cell array occurs, and it is possible for the designer or installer to select an earth leakage circuit breaker having the foregoing leak current sensitivity EL and/or the non-operating current rating. In other words, examples of design charts in FIGS. 7 and 10, showing the relationship between the earth capacitance of the solar panel, or the number or the rated power generation of the solar cell modules, and leak current, configure the present invention.

Note, the design charts shown in FIGS. 7 and 10 are not always provided in a visual form recorded on a medium, such as paper. In order to cope with a case for designing or installing the photovoltaic power generation apparatus using a computer, it is possible to provide the present invention as information showing the relationship between earth capacitance of a solar panel, or the number or the rated power generation of the solar cell modules, and leak current, as a table or as mathematical functions in a form of program codes or data recorded on magnetic recording media or optical recording media used in a computer or exchanged via communication media. More specifically, in a case where media, which can be used by a computer as measure media of the above, carry program codes or data showing information on the relationship between the earth capacitance of the solar panel, or the number or the rated power generation of the solar cell modules, and the leak current, the media also configure the present invention.

Note, the design charts shown in FIGS. 7 and 10 have the voltage and frequency of commercial AC power systems as parameters. Further, it is apparent for those who are skilled in the art that the name or the type of the solar cell module may be also included as parameters.

The present invention is not limited to the above embodiments and various changes and modifications can be made within the spirit and scope of the present invention. Therefore to apprise the public of the scope of the present invention, the following claims are made.

What is claimed is:

1. A photovoltaic power generation apparatus used in connection with a commercial AC power system, said apparatus comprising:
   a solar cell array;
   a non-insulated type inverter for converting direct-current electric power outputted from said solar cell array into alternating-current electric power; and
   an earth leakage circuit breaker provided between said non-insulated type inverter and the commercial AC power system,
   wherein stray capacitance Ca[$\mu$F] of said solar cell array with respect to a ground potential and circuit breaker interrupting rating EL[mA] of said earth leakage circuit breaker have a relationship of Ca<EL/3.

2. The photovoltaic power generation apparatus according to claim 1, wherein said solar cell array includes a plurality of solar cell modules each of which has solar cells fixed on a reinforcing plate.

3. The photovoltaic power generation apparatus according to claim 2, wherein said reinforcing plate is made of metal.

4. The photovoltaic power generation apparatus according to claim 2, wherein said solar cells are formed on a metal substrate.

5. The photovoltaic power generation apparatus according to claim 2, wherein said solar cells have non-crystalline semiconductor.

6. The photovoltaic power generation apparatus according to claim 2, wherein said solar cell module forms a building material.

7. A designing or installing method of a photovoltaic power generation apparatus, used in connection with a commercial AC power system, comprising a solar cell array, a non-insulated type inverter for converting direct-current electric power outputted from said solar cell array into alternating-current electric power, and an earth leakage circuit breaker provided between said non-insulated type inverter and the commercial AC power system, said method comprising the steps of:

measuring or estimating stray capacitance Ca[μF] of said solar cell array with respect to a ground potential; and setting circuit breaker interrupting rating EL[mA] of said earth leakage circuit breaker so that relationship of Ca<EL/3 holds.

8. A photovoltaic power generation apparatus, used in connection with a commercial AC power system, comprising a solar cell array, a non-insulated type inverter for converting direct-current electric power outputted from said solar cell array into alternating-current electric power, and an earth leakage circuit breaker provided between said non-insulated type inverter and the commercial AC power system, wherein relationship between number of solar cell modules forming said solar cell array and leak current flowing via stray capacitance of said solar cell array with respect to a ground potential is recorded in a chart used for designing or installing said photovoltaic power generation apparatus.

9. The apparatus according to claim 8, wherein the relationship between the number of the solar cell modules and the leak current is recorded, using frequency and voltage of the commercial AC power system as parameters.

10. A photovoltaic power generation apparatus, used in connection with a commercial AC power system, comprising a solar cell array, a non-insulated type inverter for converting direct-current electric power outputted from said solar cell array into alternating-current electric power, and an earth leakage circuit breaker provided between said non-insulated type inverter and the commercial AC power system, wherein relationship between rated power generation of said solar cell array and leak current flowing via stray capacitance of said solar cell array with respect to a ground potential is recorded in a chart used for designing or installing said photovoltaic power generation apparatus.

11. The apparatus according to claim 10, wherein the relationship between the rated power generation of said solar cell array and the leak current is recorded, using a type of solar cell modules forming said solar cell array as parameters.

12. The apparatus according to claim 10, wherein the relationship between the rated power generation of said solar cell array and the leak current is recorded, using frequency and voltage of the commercial AC power system as parameters.

13. A computer program product comprising a computer readable medium having computer program code, for designing or installing a photovoltaic power generation apparatus, used in connection with a commercial AC power system, comprising a solar cell array, a non-insulated type inverter for converting direct-current electric power outputted from said solar cell array into alternating-current electric power, and an earth leakage circuit breaker provided between said non-insulated type inverter and the commercial AC power system, said product comprising data which indicating relationship between number of solar cell modules forming said solar cell array and leak current flowing via stray capacitance of said solar cell array with respect to a ground potential.

14. A computer program product comprising a computer readable medium having computer program code, for designing or installing a photovoltaic power generation apparatus, used in connection with a commercial AC power system, comprising a solar cell array, a non-insulated type inverter for converting direct-current electric power outputted from said solar cell array into alternating-current electric power, and an earth leakage circuit breaker provided between said non-insulated type inverter and the commercial AC power system, said product comprising data which indicating relationship between rated power generation of said solar cell array and leak current flowing via stray capacitance of said solar cell array with respect to a ground potential.

* * * * *

UNITED STATES PATENT AND TRADEMARK OFFICE
CERTIFICATE OF CORRECTION

PATENT NO.   : 6,107,560
DATED        : August 22, 2000
INVENTOR(S)  : NOBUYOSHI TAKEHARA ET AL.         Page 1 of 2

It is certified that error appears in the above-identified patent and that said Letters Patent is hereby corrected as shown below:

IN THE DRAWINGS:

Sheet 4 of 11, FIG. 4, "CATHOD" should read
--CATHODE--; and
Sheet 6 of 11, FIG. 6, "INSULTING" should read
--INSULATING--.

COLUMN 2:

Line 26, "EL[MA]" should read --EL[mA]--.

COLUMN 3:

Line 27, "EMBODIMENT" should read --EMBODIMENTS--.

COLUMN 7:

Line 33, "Experiment 1" should read --Experiments 1--;
Line 34, "following" should read -- the following--; and
Line 57, "the" should be deleted.

COLUMN 9:

Line 23, "relationship between number" should read
--a relationship between the number--; and
Line 41, "relationship between rated" should read
--a relationship between the rated--.

UNITED STATES PATENT AND TRADEMARK OFFICE
CERTIFICATE OF CORRECTION

PATENT NO. : 6,107,560
DATED : August 22, 2000
INVENTOR(S) : NOBUYOSHI TAKEHARA ET AL.

It is certified that error appears in the above-identified patent and that said Letters Patent is hereby corrected as shown below:

COLUMN 10:

Line 7, "modules" should read --module--;
    Line 24, "indicating relationship between number" should read --indicate a relationship between the number--; and
    Line 38, "indicating relationship between rated" should read --indicate a relationship between the rated--.

Signed and Sealed this

Twenty-ninth Day of May, 2001

Attest:

NICHOLAS P. GODICI

*Attesting Officer*    *Acting Director of the United States Patent and Trademark Office*